United States Patent [19]
Garrett

[11] 4,444,643
[45] Apr. 24, 1984

[54] PLANAR MAGNETRON SPUTTERING DEVICE

[75] Inventor: Charles B. Garrett, San Jose, Calif.

[73] Assignee: Gartek Systems, Inc., Sunnyvale, Calif.

[21] Appl. No.: 504,598

[22] Filed: Jun. 16, 1983

Related U.S. Application Data

[63] Continuation-in-part of Ser. No. 414,649, Sep. 3, 1982, abandoned.

[51] Int. Cl.³ .................................................. C23C 15/00
[52] U.S. Cl. .................................. 204/298; 204/192 R
[58] Field of Search ............................. 204/192 R, 298

[56] References Cited
FOREIGN PATENT DOCUMENTS
2707144 8/1977 Fed. Rep. of Germany ...... 204/298

OTHER PUBLICATIONS
"Orbitorr–Dynamic Planar Magnetron Sputtering Source", Sloan Technology Corp., Santa Barbara, CA., (1977).

*Primary Examiner*—Aaron Weisstuch
*Attorney, Agent, or Firm*—Thomas E. Schatzel

[57] ABSTRACT

A planar magnetron sputtering device having a movable magnetic source which is hydraulically moved with respect to a target and substrate to cause lines magnetic flux parallel to the surface of the target to sweep over the surface of the target during the sputtering process.

14 Claims, 11 Drawing Figures

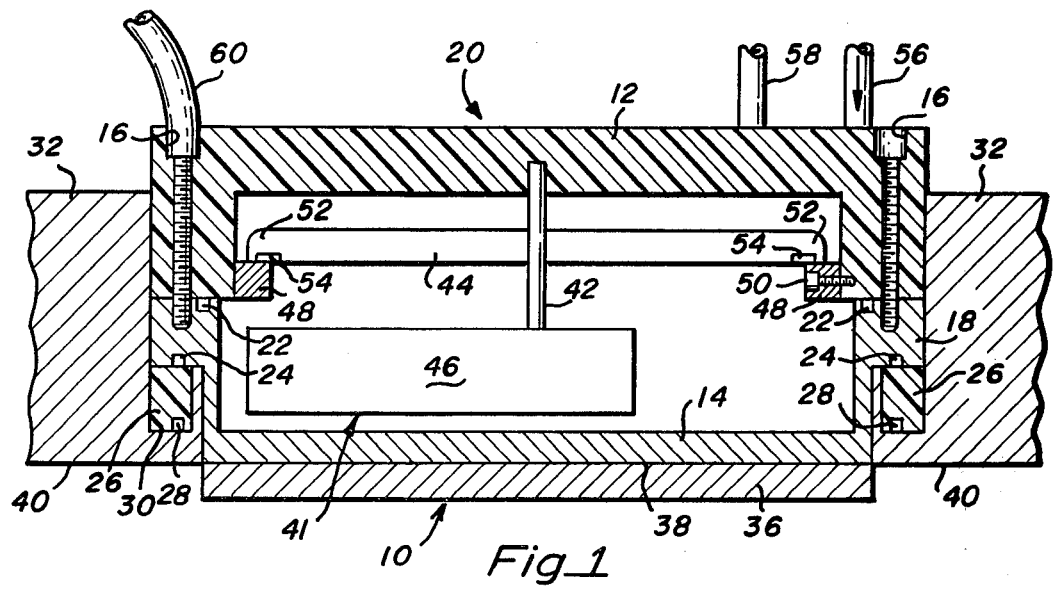
Fig_1
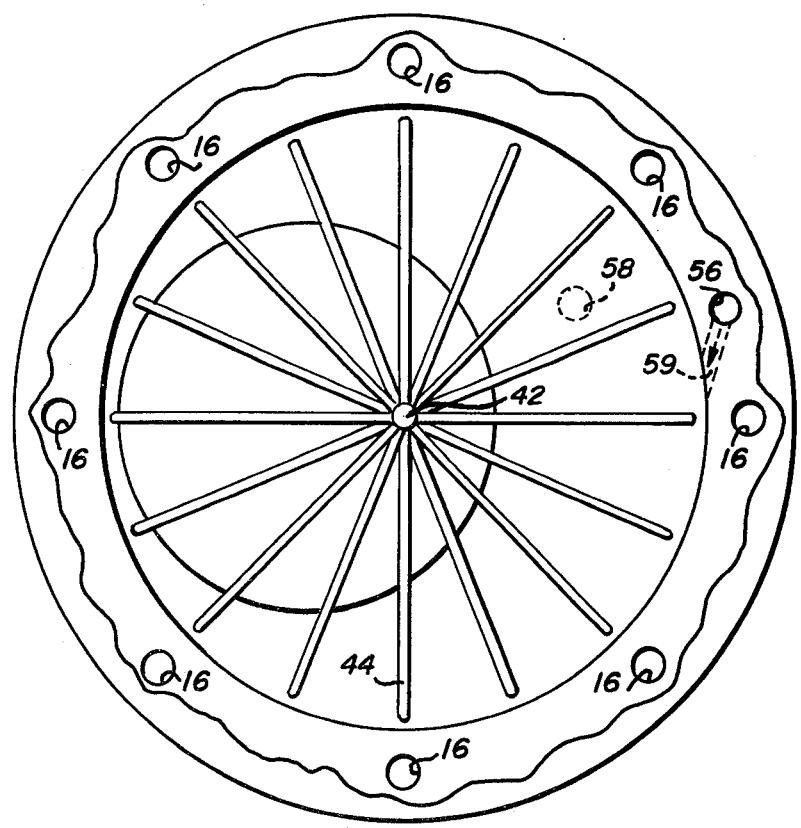
Fig_2

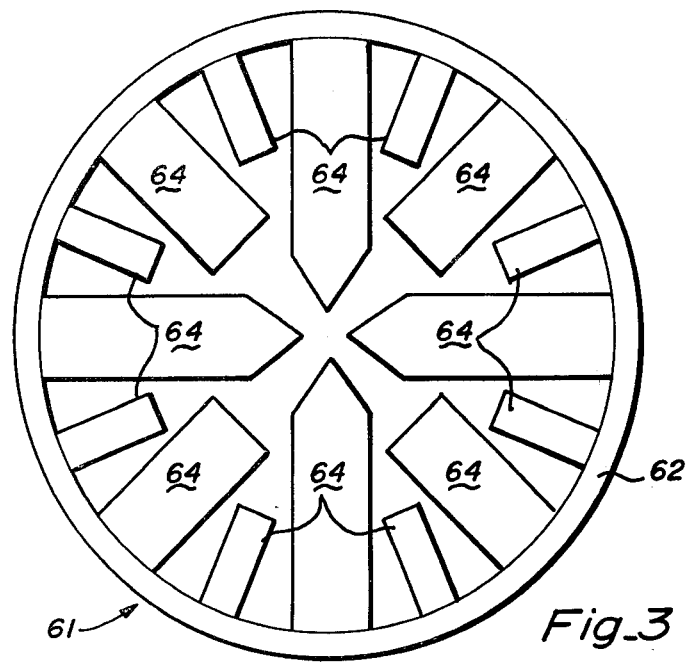
Fig_3
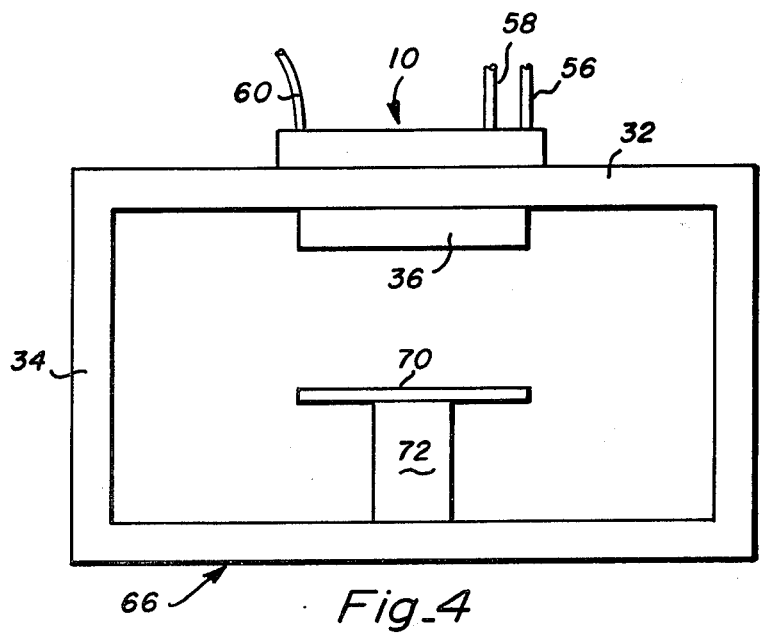
Fig_4
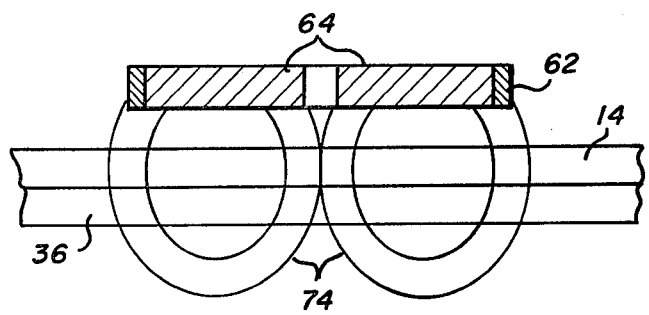
Fig_5

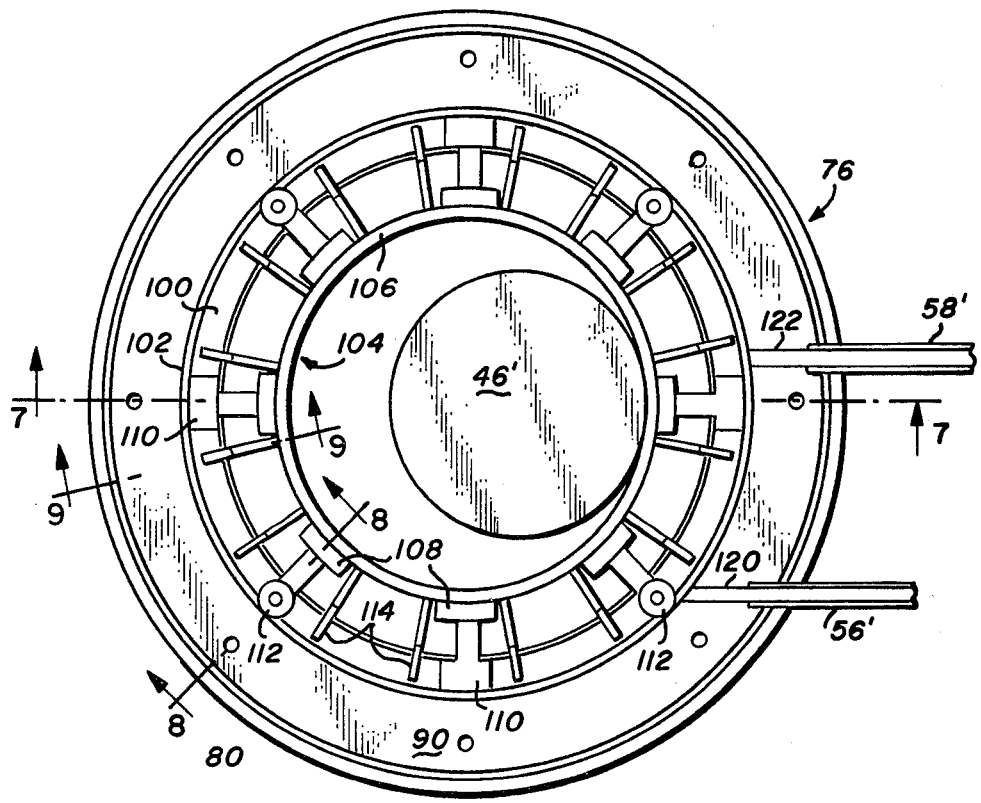
Fig_6
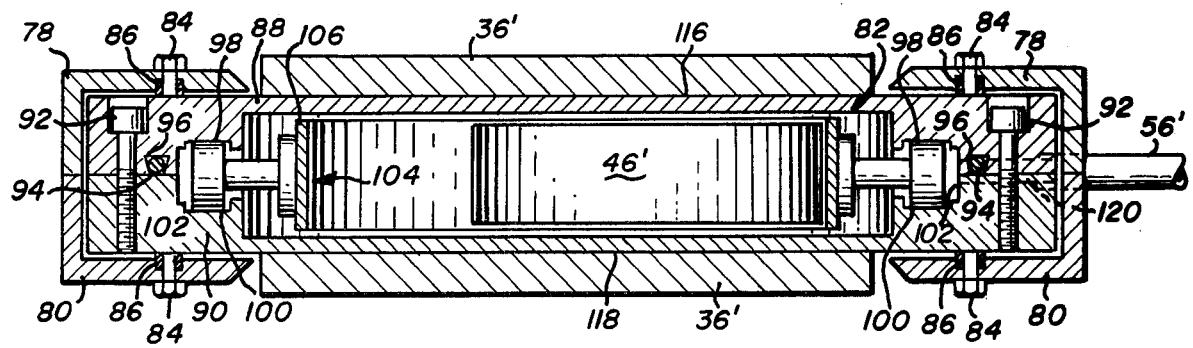
Fig_7
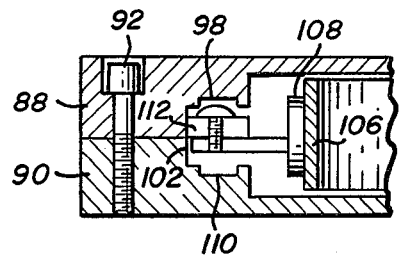
Fig_8
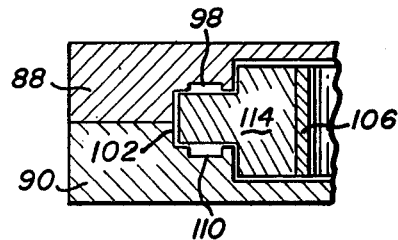
Fig_9

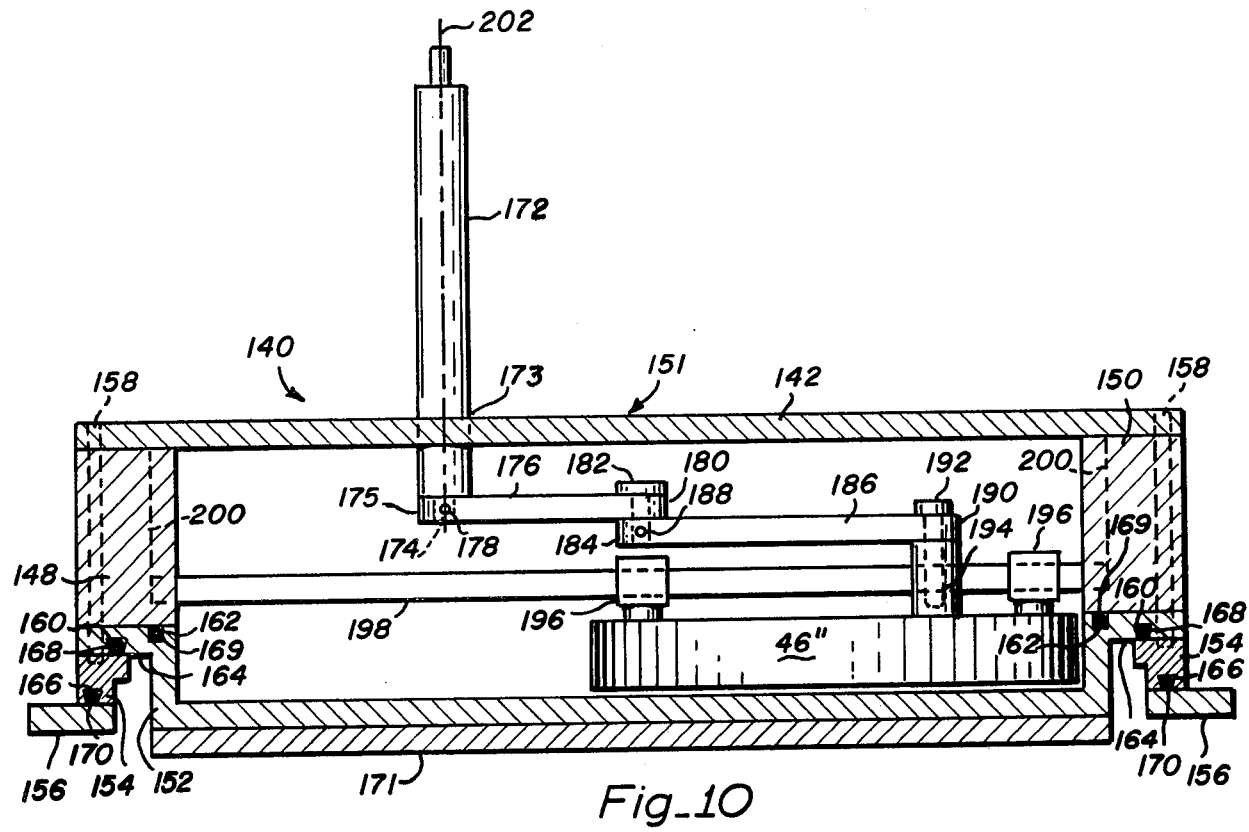
Fig_10
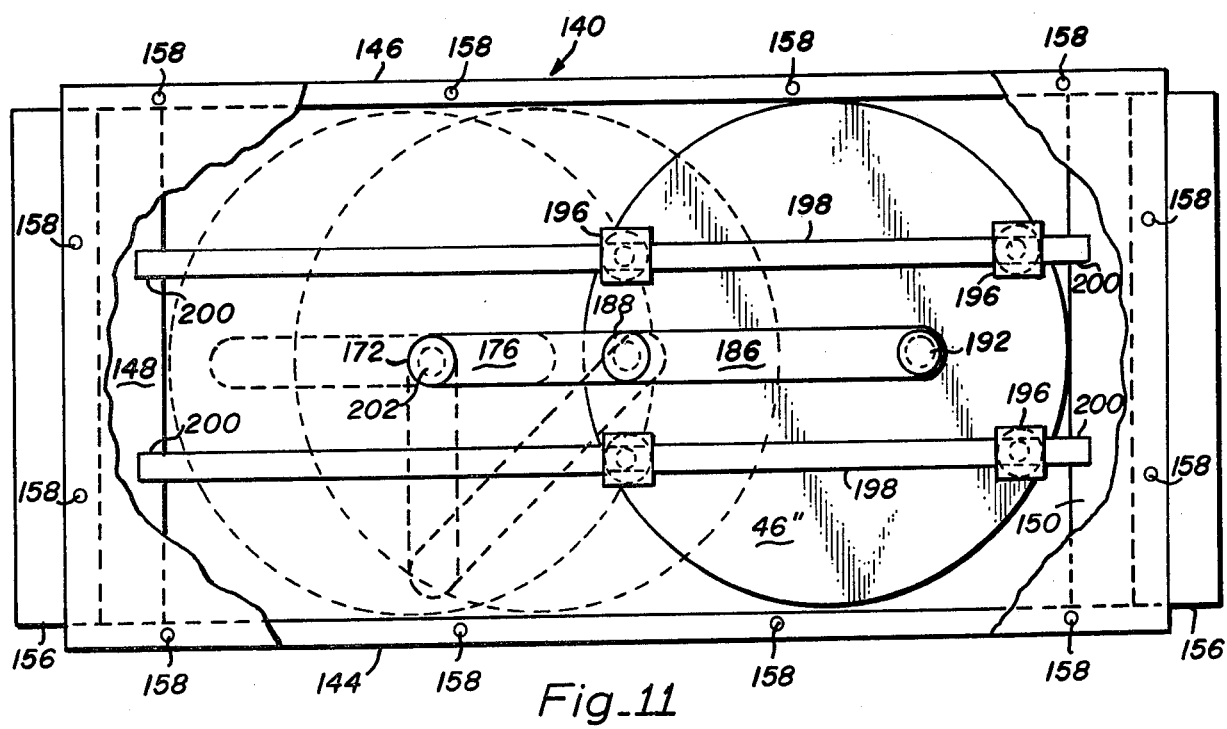
Fig_11

PLANAR MAGNETRON SPUTTERING DEVICE

This is a continuation in part of Application Ser. No. 414,649 filed Sept. 3, 1982, abandoned.

BACKGROUND OF THE INVENTION

1. Field of the Invention

This invention relates generally to planar magnetron sputtering devices and more particularly to a planar magnetron sputtering device with a moving magnetic field to provide greater and more uniform utilization of the target sputtering material and uniform deposition on a substrate.

2. Description of the Prior Art

Devices by which substrates are coated by a sputtering process are well known. A target material subject to a magnetic field is placed in an inert gas environment in proximity to a substrate and a DC or RF voltage is applied, resulting in the transfer of target material from the target to the substrate. Since the development of this technology it has been an objective to increase the utilization of target material. Targets are made from expensive metal and any means by which more of that metal can be used for sputtering before the target must be replaced is desirable and economical. Beyond the expense of the targets themselves is the lost production time while the sputtering process must be terminated for target replacement. By increasing the life of a target the lost production time can be minimized.

It is well known that maximum erosion of a target occurs where lines of magnetic flux are parallel with the surface of the target. The magnetic flux is provided by magnets located in proximity to the target. Magnetic lines of flux typically form closed loops extending from one pole of a magnet to the opposite pole. Where the magnetic field remains stationary during the sputtering process the maximum erosion of the target takes the form of a groove in the target. Typically, such grooved erosion patterns are in the form of a race track, but depend on the location of the stationary magnets with respect to target surface. One example of an attempt to increase target utilization is disclosed in U.S. Pat. No. 3,956,093 issued to Paul S. McLeod. McLeod discloses a second magnetic field normal to a first magnetic field to flatten the shape of the flux pattern, thereby having lines of flux parallel to the target surface over a greater portion of that surface.

Other attempts to flatten the flux pattern over the target are found in U.S. Pat. Nos. 4,312,731 and 4,162,954 issued to Charles F. Morrison. Additionally, U.S. Pat. Nos. 4,175,030 and 4,116,806 issued to Robert B. Love, et al. disclose other approaches to solving the target erosion pattern problem. However, none of the prior art mentioned above discloses movement of the source of the magnetic field to accomplish their goals. While improving target utilization, the prior art devices still are characterized by target erosion patterns which resemble a groove running over the surface of the target. Typically, only forty to fifty percent of the target material is used before it must be replaced.

Where grooved erosion patterns occur, there is a risk that the entire thickness of the target will be exhausted at the bottom of the groove, thereby contaminating the substrate with the material on which the target is mounted. Therefore, it may be safe to only use approximately forty percent of the target in order to avoid the contamination problem. In some instances, the target is bonded to its mounting plate. The bonding process is fairly expensive and this expense increases as the frequency of target replacement increases.

SUMMARY OF THE INVENTION

It is therefore an object of the present invention to provide an improved planar magnetron sputtering device which increases the amount of target material used before the target must be replaced.

It is a further object to provide an improved planar magnetron sputtering device which increases the time between target replacement.

It is a further object to provide an improved planar magnetron sputtering device which umiformly depletes the target.

It is a further object to provide an improved planar magnetron device which coats a substrate with a uniform thickness of target material.

Briefly, a preferred embodiment of the present invention includes a magnet assembly which is rotated over a planar surface to which a planar target is attached, thereby creating a magnetic field pattern which is constantly changing with respect to any particular location on the target's surface. A circular magnet assembly is attached to an arm which is connected to a rotating shaft driven by an axial vaned water wheel such that the magnet assembly is eccentric to the rotating shaft. The magnet assembly is moved over the surface of a plate. A planar target is attached to the opposite side of the plate and extends into a process chamber which has been evacuated and then into which a low pressure atmosphere of an inert gas has been introduced. A direct current voltage is applied to the target, creating an electrostatic field between the target and a substrate located in the process chamber directly below the target and in a parallel plane therewith. Electrons are removed from the target and in turn ionize the inert gas. Gas ions impact the target, dislodging atoms or molecules of the target material. The dislodged target material is then deposited on the substrate. When a sputtering device uses the rotating magnet assembly, the target is uniformly depleted and the coating on the substrate is of uniform thickness.

An advantage of the planar magnetron sputtering device of the present invention is that the amount of target used before replacement is necessary is increased.

Another advantage is that the planar magnetron sputtering device increases the time between target replacements.

A further advantage is that the target is uniformly depleted over its surface area.

A further advantage is that the coating deposited on a substrate is of uniform thickness.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a cross-sectional view of a water driven magnet assembly in accordance with the present invention;

FIG. 2 is a top elevational view of the water driven magnet assembly of FIG. 1;

FIG. 3 is a top elevational view of a ring and magnet subassembly;

FIG. 4 is a front view of a planar magnetron sputtering device of the present invention with the front wall removed;

FIG. 5 is partial cross-sectional view of the magnet subassembly and target;

FIG. 6 is a top view of a first alternative embodiment with the upper mounting plate removed;

FIG. 7 is a cross-sectional view of the alternative embodiment of FIG. 6 taken along line 7—7;

FIG. 8 is a cross-sectional view of the alternative embodiment of FIG. 6 taken along line 8—8;

FIG. 9 is a cross-sectional view of the alternative embodiment of FIG. 6 taken along line 9—9;

FIG. 10 is a front view of a second alternative embodiment with the front cover removed; and FIG. 11 is a top view of the alternative embodiment of FIG. 10.

DETAILED DESCRIPTION OF THE PREFERRED EMBODIMENTS

In FIG. 1, there is illustrated a water driven magnet assembly referred to by the general reference numeral 10. The magnet assembly 10 includes an insulating cap 12 which is rigidly attached to a lipped mounting plate 14 by a plurality of fasteners 16 (see also FIG. 2). The fasteners 16 extend through insulating cap 12 and into a lip 18 of mounting plate 14 to form a magnetic housing assembly referred to by general reference numberal 20. The lip 18 of mounting plate 14 is grooved on its upper and lower surfaces to receive gaskets 22 and 24. The magnet housing assembly 20, rests on an insulating ring 26 which is grooved on its lower side to receive a gasket 28. The insulating ring 26 in turn rests in a circumferential slot 30 in a process chamber top 32 (see also FIG. 4). The weight of the magnet housing assembly 20 holds it in place and it is sealed by a lower than atmospheric pressure maintained in a process chamber 34 (see FIG. 4) during the operation of the device.

A target 36 is rigidly attached to a lower surface 38 of the lipped mounting plate 14 by a plurality of fasteners (not shown) or other bonding means. The target 36 in the preferred embodiment is a disk. Various other target configurations are compatible with the present invention, as will be discussed below. The lower surface 38 is approximately flush with an interior surface 40 of the process chamber top 32. The target 36 extends into the process chamber 34.

Within the magnet housing assembly 20 is mounted a magnet drive assembly referred to by the general reference numeral 41. The drive assembly 41 consists of a drive shaft 42 rotatably mounted in insulating cap 12. A multi-vaned paddle wheel 44 is rigidly attached to drive shaft 42. Below multi-vaned paddle wheel 44 on drive shaft 42 is mounted an encased magnet subassembly 46. The magnet drive assembly 41 is supported by and rides on a bearing ring 48 which is attached to insulating cap 12 by a plurality of fasteners 50 (only one shown). The outer end 52 of each vane of multi-vaned paddle wheel 44 is fitted with a nylon roller 54 which rides on bearing ring 48 when the magnet drive assembly 41 is rotated.

A coolant inlet 56 and coolant outlet 58 are connected to passages in insulating cap 12. The direction of flow is shown in FIG. 2 by an arrow in a passage 59 connected to inlet 56. The inlet coolant passage through insulating cap 12 is arranged such that the coolant enters the magnet housing assembly 20 so that it impinges on multi-vaned paddle wheel 44 at the mid-point of outer end 52. One fastener 16 is adapted to receive an electrical wire 60 which electrically connects one terminal of a DC power supply to target 36, through lipped mounting plate 14.

Referring to FIG. 3, a magnet and ring subassembly 61 is shown comprising a magnetically permeable ring 62 with a plurality of permanent magnets 64 arranged radially inward about the inner circumference of ring 62. The arrangement of the magnets is symmetric such that each magnet 64 is paired with another on a diametric of the ring 62. The magnets 64 can be arranged such that similar poles are toward the center of ring 62 or such that alternating poles are toward the center. The magnetic attraction of the ring 62 to the magnets 64 will hold them in their general positions. In order to fix the magnets 64 positions more permanently, any type of metal glue or epoxy can be used. The magnets 64 may also be arranged in a conical shape as well as being arranged in the same plane.

The magnet and ring subassembly 61 is encased in stainless steel to form the encased magnet subassembly 46. Such encapsulation inhibits corrosion when subassembly 46 is immersed in coolant which is typically water.

As illustrated in FIG. 4, the water driven magnet assembly 10 is part of a planar magnetron sputtering device referred to by general reference numeral 66 and including a process chamber 34 into which target 36 extends. The target 36 is directly above and in parallel plane to a substrate 70. When the target 36 and substrate 70 are circular they are located concentrically. The substrate 70 is supported by a pneumatic pedestal 72. The process chamber 34 is fitted with conventional loading and unloading vacuum type doors (not shown) and with an evacuation means and an inert gas supply means (not shown).

The substrate 70 is positioned within the process chamber 34 on pedestal 72 directly beneath the target 36. A vacuum is drawn on the process chamber 34 and then an inert gas at a low pressure is introduced into the process chamber 34. Coolant under pressure is permitted to enter the magnet housing assembly 20 through coolant inlet 56. The coolant then performs two functions. First, during operation of sputtering device 66 the heat generated in the target 36 and conducted to lipped mounting plate 14 is transferred to and removed by the coolant. The coolant performs its second function by impinging on multi-vaned paddle wheel 44, which causes it to turn. The coolant then exits the magnet housing assembly 20 through coolant outlet 58.

The rotation of the multi-vaned paddle wheel 44 causes the drive shaft 42 to turn, which causes the encased magnet subassembly 46 to be moved in a translational and/or rotational pattern. As shown in FIG. 2 the connection between drive shaft 42 and encased magnet subassembly 46 is such as to impart eccentric rotation. The encased magnet subassembly 46 moves in a parallel plane to the target 36. Lines of magnetic flux are produced by the magnets 64 within the encased magnet subassembly 46. These lines of magnetic flux form closed looped pairs 74 extending from one pole on magnets 64 to the opposite pole. The loop pairs 74 pass through and over the target as illustrated in FIG. 5. The axial arrangement of magnet 64 within the magnet and ring subassembly 60 causes the creation of a series of loop pairs 74 in planes normal to the plane of the target 36 and along diameters through pairs of magnets 64.

With the encased magnet subassembly 46 in motion and the resulting lines of magnetic flux being swept over the surface of the target 36, a direct current voltage is applied to the target 36 through electrical wire 60, thereby establishing an electrostatic field between the target 36 and substrate 70. The inert gas is ionized by electrons from the target 36 and such ions impact the target 36, causing atoms or molecules of target material to be dislodged. Such target material is then deposited on the substrate. Since the lines of magnetic flux which are parallel to the plane of the target surface are continuously moving over the target surface in a uniform manner the target is depleted uniformly and the typical grooved erosion pattern is not present.

The alternative embodiment illustrated in FIGS. 6 through 9 is a dual target water driven magnet assembly referred to by the general reference numeral 76 which includes an upper ground ring 78 and a lower ground ring 80 which are mounted about a magnet housing assembly referred to by general reference numeral 82. A plurality of fasteners 84 (only four shown) are used to accomplish the mounting. Said fasteners 84 are insulated from magnet housing assembly 82 by a plurality of insulators 86. An upper mounting plate 88 and a lower mounting plate 90 are joined together by a plurality of fasteners 92 to form magnetic housing assembly 82. A seal is formed between the upper and lower mounting plates 88 and 90 by an O-ring 94 installed in a groove 96 in upper mounting plate 88. The joinder of upper and lower mounting plates 88 and 90 forms an upper horizontal bearing groove 98, a lower horizontal bearing groove 100 and a vertical bearing groove 102. Within magnetic housing assembly 82 is mounted a multi-vaned paddle wheel referred to by general reference numeral 104 which comprises a ring 106, a plurality of bearing assembly mounts 108, a plurality of horizontal roller bearing assemblies 110, a plurality of vertical roller bearing assemblies 112 and a plurality of vanes 114.

An encased magnet subassembly 46' is attached to the inner surface of said ring 106 such that the encased magnet subassembly 46' is eccentric to said ring 106. The encased magnet subassembly 46' is of similar construction as encased magnet subassembly 46 as described above and illustrated in FIGS. 1 through 3. A pair of targets 36' are attached to outer surface 116 of upper mounting plate 88 and an outer surface 118 of lower mounting plate 90. A coolant inlet 56' and a coolant outlet 58' are connected to two passages 120 and 122, respectively, in the magnet housing assembly 82 such that coolant entering assembly 82 impinges on vanes 114. The dual target water driven magnet assembly 76 can be mounted so that targets 36' are in either the horizontal or vertical plane within a process chamber with the DC or RF power available and connected to assembly 76 such that it is cathodic when power is applied. Substrates may be positioned proximate to targets 36' and in parallel planes therewith. More than one dual target water driven magnet assembly 76 can be mounted within the process chamber such that more than two substrates can be coated simultaneously.

When coolant under pressure is introduced at coolant inlet 56' the coolant impinges on vanes 114, causing the multi-vaned paddle wheel 104 to rotate. When the dual target auto driven magnet assembly 76 is oriented such that targets 36' are in a horizontal plane, the paddle wheel rides on horizontal roller bearing assemblies 110 in upper and lower horizontal bearing grooves 98 and 100. When assembly 76 is oriented vertically, paddle wheel 104 rides on vertical roller bearing assemblies 112 and vertical bearing groove 102. When paddle wheel 104 rotates it causes encased magnet subassembly 46' to eccentrically rotate, thus sweeping the magnetic field created over the outer surfaces of targets 36', resulting in the uniform depletion of targets 36' in a manner similar to that described above.

A second alternative embodiment is illustrated in FIGS. 10 and 11. A translational magnet assembly referred to by the general reference numeral 140 includes a top cover 142, a front cover 144, a back cover 146, a first side piece 148, a second side piece 150, a bottom mounting plate 152, an insulator 154, and a process chamber mount 156. The top cover 142 is fastened to the bottom mounting plate 152 and insulator 154 by a plurality of fasteners 158 which pass through front cover 144, back cover 146, first side piece 148 and second side piece 150, creating a magnet housing assembly 151.

A first and a second O-ring groove 160 and 162 is provided on a lipped portion 164 of bottom mounting plate 152. A third O-ring groove 166 is provided on insulator 154. Each of O-ring grooves 160, 162 and 166 contain O-rings 168, 169 and 170, respectively, such that a seal is formed between bottom mounting plate 152 and insulator 154 and between insulator 154 and process chamber mount 156. A target 171 is mounted on bottom mounting plate 156 using fasteners (not shown) or other appropriate bonding means.

A shaft 172 extends into magnet housing assembly 151 through a penetration 173 in top cover 142. The axis of shaft 172 is perpendicular to the plane of bottom mounting plate 152 and is located on the longitudinal center line of magnet housing assembly 151. A lower end 174 of shaft 172 is adapted to extend through a first end 175 of a first linkage 176 which is in a plane parallel to the plane of the bottom mounting plate 152. A first pin 178 extends through first linkage 176 and lower end 174 such that there is no relative motion permitted between shaft 170 and first linkage 176.

A second end 180 of first linkage 176 is adapted to receive a second pin 182 which passes through first linkage 176 and into a first end 184 of a second linkage 186. A third pin 188 extends through the first end 184 of second linkage 186 and second pin 182 such that first linkage 176 may pivot about second pin 182. A second end 190 of second linkage 186 is adapted to receive a fourth pin 192 which is secured in a receptacle 194 which is rigidly mounted on an encased magnet subassembly 46" such that second linkage 186 may pivot about fourth pin 192. Encased magnet subassembly 46" is of similar construction as encased magnet subassembly 46 described above and illustrated in FIGS. 1, 2 and 3.

A plurality of guide shaft receivers 196 are rigidly mounted on encased magnet subassembly 46" such as to slidingly receive a pair of guide shafts 198. Guide shafts 198 are mounted in a plurality of slots 200 in first and second side pieces 148 and 150.

During operation, shaft 172 is connected to a rotating means such that shaft 172 is rotated about a longitudinal axis 202. Such rotation causes first linkage 176 to pivot about said longitudinal axis 202 in a plane substantially parallel to the plane of bottom mounting plate 152.

As first linkage 176 pivots, it pulls second linkage 186 such that a force is exerted on encased magnet subassembly 46" through fourth pin 192 and receptacle 194. Since the motion of encased magnet subassembly 46" is restricted by guide shafts 198 through guide shaft receivers 196, the force exerted on encased magnet subassembly 46'' causes translation of subassembly 46''.

As first linkage 176 continues to pivot, encased magnet subassembly 46'' is moved as shown in phantom on FIG. 11 such that upon one complete rotation of first linkage 176 about longitudinal axis 202, encased magnet subassembly 46'' will have been moved completely across and over target 168 and returned to its original position as illustrated in FIG. 10. The motion of encased magnet subassembly 46'' is repeated as shaft 172 continues to rotate. Thus, the magnetic field created by encased magnet subassembly 46'' is swept over target 171, resulting in uniform depletion of target material during sputtering operations. In operation, translational magnet assembly 140 would be supplied with appropriate electrical power and coolant means so as to function as a DC or RF magnetron. Assembly 140 would also be mounted and sealed over an aperture in a process chamber such as that described as process chamber 34 above so as to position target 171 in proximity to a surface to be coated which is in a plane substantially parallel to that of target 171.

Another alternative embodiment uses a plurality of encased magnet subassemblies driven by a common shaft in an eccentric manner. The sizes of the rings 62 and the magnets 64 therein can vary and are not limited to the sizes and numbers shown in the drawings. However, the typical sizes of the substrates to be coated range between three and five inches in diameter. However, this is based totally on the needs of industry and is not a limit on the capability of the present invention.

Although the water driven drive of the present invention is convenient in that it performs two functions, it should not be interpreted as the only means for producing movement of the magnetic source. Beside hydraulic, the drive means may be electrical or magnetic. The speed of the drive can be controlled in the present invention by increasing or reducing the flow of coolant to the magnet housing assembly 20.

In order to protect the device from overheating, a water/rotation interlock can be provided to interrupt the DC power supply if there is no rotation of drive shaft 42 or no water flow through coolant inlet 56.

The motion of the magnetic source may, in an altenative embodiment, be random in nature as opposed to the uniform motion. It should also be noted that the plane of the magnetic source may be raised or lowered with respect to the target by adjusting the length of the drive shaft 42 or operating without the bearing ring 48 and nylon rollers 54, thereby allowing encased magnet subassembly to be in contact with the upper surface of lipped mounting plate 14.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A planar magnetron sputtering device, comprising in combination:
   a low pressure inert gas chamber including means for positioning an object of having a surface to be coated;
   means within said chamber for providing a source of coating material wherein, said source of coating material has a planar target surface, and
   a magnetic source means positioned behind said target surface and comprising a plurality of permanent magnets radially oriented within a magnetically permeable ring encased in a corrosion resistant material and which is connected to a drive shaft driven by vanes adapted to be struck by a flow of coolant to cause movement of the magnetic source means with respect to the source of coating material such that the lines of magnetic flux created sweep the target surface of the source of coating material;
   whereby the coating material may be transferred from the source of coating material to the surface to be coated and the motion of the magnetic source can deplete the source of coating material uniformly and coat the surface to be coated uniformly.

2. The device of claim 1 further including,
   a plurality of magnetic source means, each of which is movable relative to the source of coating material.

3. The device of claim 1 wherein
   the coolant caused motion of the magnetic source is random.

4. The device of claim 1 wherein
   the coolant caused motion of the magnetic source means is circular.

5. The device of claim 1 wherein:
   said source of coating material comprises a pair of planar targets oriented in substantially parallel planes with said magnetic source means intermediate to and in a parallel plane with said planar targets.

6. The device of claim 5 wherein
   more than one pair of said planar targets and magnetic source means associated therewith may be located within said low pressure inert gas chamber.

7. The device of claim 1 wherein:
   said source of coating material is a rectangular plate.

8. The device of claim 1 wherein
   said coolant acting on said vanes causes translational motion of said magnetic source means.

9. A planar magnetron sputtering device comprising in combination:
   a mounting plate with planar surfaces;
   a plurality of magnetic source means;
   means for receiving the plurality of magnetic source means;
   a hydraulic pressure source positioned to act on a multi-vane means associated with said magnetic source means such that said magnetic source means are moved over a first side of the mounting plate;
   a target material having a planar target surface attached to a second, opposite side of the mounting plate;
   means for removing heat from said mounting plate;
   means for applying a direct current potential to the mounting plate;
   means for supporting a substrate in a parallel plane below the target;
   a process chamber in which the target material and the substrate are located;
   means for evacuating the process chamber; and
   means for injecting an inert gas into the process chamber;

whereby the magnetic source means may be moved over the first side of the mounting plate to cause the lines of magnetic flux parallel to the surface of the plate to move over the planar target surface of the target material at the same time the direct current potential is applied in a low pressure environment of the inert gas, and the target material may be uniformly deleted and the of target material uniformly deposited on the substrate.

10. The device of claim 9 wherein:
the magnetic source means includes a plurality of permanent magnets arranged as radial spokes within a retaining ring.

11. The device of claim 9 wherein:
the permanent magnets are arranged with alternating poles towards a center of the retaining ring.

12. A planar magnetron sputtering device, comprising in combination:
a low pressure gas chamber including means for positioning an object having a surface to be coated;
means within said chamber for providing a planar source of coating material having a planar target surface;
means for creating an electrostatic field between said surface to be coated and the source of coating material;
a magnetic source means positioned behind said planar target surface;
a hydraulic means for moving the magnetic source relative to the source of coating material such that the lines of magnetic flux created sweep said planar target surface of said source of coating material;
whereby the coating material may be transferred from the source of coating material to the surface to be coated and the motion of the magnetic source can deplete the source of coating material uniformly and coat the surface to be coated uniformly.

13. The device of claim 12 wherein:
said magnetic source means comprises a plurality of permanent magnets radially oriented and encased in a corrosion resistant material.

14. The device of claim 12 wherein:
said hydraulic means comprises a coolant used to remove heat generated in said source of coating material.

* * * * *